(12) United States Patent
Gong et al.

(10) Patent No.: US 11,721,749 B2
(45) Date of Patent: Aug. 8, 2023

(54) IGBT POWER DEVICE

(71) Applicant: SUZHOU ORIENTAL SEMICONDUCTOR CO., LTD., Jiangsu (CN)

(72) Inventors: Yi Gong, Jiangsu (CN); Lei Liu, Jiangsu (CN); Wei Liu, Jiangsu (CN); Yuanlin Yuan, Jiangsu (CN); Xin Wang, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 17/428,142

(22) PCT Filed: Dec. 6, 2019

(86) PCT No.: PCT/CN2019/123759
§ 371 (c)(1),
(2) Date: Aug. 3, 2021

(87) PCT Pub. No.: WO2021/103113
PCT Pub. Date: Jun. 3, 2021

(65) Prior Publication Data
US 2022/0285535 A1 Sep. 8, 2022

(30) Foreign Application Priority Data
Nov. 27, 2019 (CN) .......................... 201911183421.1

(51) Int. Cl.
*H01L 29/739* (2006.01)
*H01L 27/06* (2006.01)
(Continued)

(52) U.S. Cl.
CPC ...... *H01L 29/7395* (2013.01); *H01L 27/0629* (2013.01); *H01L 29/0821* (2013.01); *H01L 29/7889* (2013.01)

(58) Field of Classification Search
CPC ............. H01L 27/0629; H01L 29/0821; H01L 29/7395
See application file for complete search history.

(56) References Cited

U.S. PATENT DOCUMENTS

| 2015/0364584 A1 | 12/2015 | Ryu et al. |
| 2016/0111533 A1 | 4/2016 | Yen et al. |
| 2018/0226500 A1* | 8/2018 | Zhou .................. H01L 29/0696 |

FOREIGN PATENT DOCUMENTS

| CN | 104465381 | | 3/2015 | |
| CN | 104465381 A | * | 3/2015 | ....... H01L 29/42324 |

(Continued)

OTHER PUBLICATIONS

PCT/CN2019/123759 International Search Report dated Jul. 30, 2020.

*Primary Examiner* — Nelson Garces
(74) *Attorney, Agent, or Firm* — Michael Best & Friedrich LLP

(57) ABSTRACT

Provided is an insulated gate bipolar transistor power device. The IGBT power device includes a gate dielectric layer located above the two p-type body regions and the n-type drift region between the two p-type body regions, an n-type floating gate located above the gate dielectric layer; a gate located above the gate dielectric layer and the n-type floating gate; an insulating dielectric layer between the gate and the n-type floating gate; a first opening located in the gate dielectric layer, where the n-type floating gate is in contact with one of the two p-type body regions through the first opening to form a p-n junction diode; and a second opening located in the gate dielectric layer, where the n-type (Continued)

floating gate is in contact with the other of the two p-type body regions through the second opening to form the p-n junction diode.

5 Claims, 3 Drawing Sheets

(51) Int. Cl.
    *H01L 29/08*         (2006.01)
    *H01L 29/788*      (2006.01)

(56)            References Cited

FOREIGN PATENT DOCUMENTS

JP         2012099630      5/2012
JP         2012099630 A  *  5/2012

* cited by examiner

IGBT POWER DEVICE

CROSS-REFERENCE TO RELATED APPLICATIONS

This is a National Stage Application filed under 35 U.S.C. 371 based on International Patent Application No. PCT/CN2019/123759, filed on Dec. 6, 2019, which claims priority to Chinese Patent Application No. 201911183421.1 filed on Nov. 27, 2019, the disclosures of both of which are incorporated herein by reference in their entireties.

TECHNICAL FIELD

The present application belongs to a technical field of insulated gate bipolar transistor (IGBT) devices and, for example, to an IGBT device with a fast reverse recovery speed.

BACKGROUND

As shown in FIG. 1, a sectional view of an IGBT power device in the related art includes a p-type collector region 31 and an n-type collector region 3 which are spaced apart at the bottom, where the p-type collector region 31 and the n-type collector region 3 are connected to a collector voltage through a collector metal contact layer 70; an n-type field cut-off region 32 above the p-type collector region 31 and the n-type collector region 3; an n-type drift region 30 above the n-type field cut-off region 32; at least two p-type body regions 33 located at a top of the n-type drift region 30, where an n-type emitter region 34 is provided in each of the at least two p-type body regions 33, the n-type emitter region 34 and the p-type body region 33 are connected to an emitter voltage through an emitter metal contact layer 47, and a p-type body region contact region 38 is used for reducing a contact resistance of the p-type body region 34; and a gate dielectric layer 35 and a gate 36 for controlling the current channel of the IGBT power device to turn on and turn off, where the gate 36 and the emitter metal contact layer 47 are insulated by an insulating dielectric layer 50, and the insulating dielectric layer 50 is an interlayer insulating dielectric layer.

In a case where the IGBT power device is turned off in the related art, a reverse current flows from the emitter to the collector through the body diode parasitic in the IGBT power device. In this case, the current in the body diode injects minority carriers, and these minority carriers perform reverse recovery when the IGBT device turns on again, causing a relatively large reverse recovery current and long reverse recovery time.

SUMMARY

The present application provides an IGBT device with a fast reverse recovery speed, so as to solve the technical problem of long reverse recovery time caused by the minority carriers injection problem of an IGBT device in the related art.

An IGBT power device is provided in an embodiment of the present disclosure and includes: an n-type collector region and a p-type collector region, an n-type drift region located above the n-type collector region and the p-type collector region, at least two p-type body regions located at a top of the n-type drift region, wherein two of the at least two p-type body regions are isolated by the n-type drift region; and an n-type emitter region located within each of the at least two p-type body regions; a gate dielectric layer located above the two p-type body regions and the n-type drift region between the two p-type body regions, an n-type floating gate located above the gate dielectric layer; a gate located above the gate dielectric layer and the n-type floating gate, where the gate covers two side walls of the n-type floating gate in a lateral direction; an insulating dielectric layer between the gate and the n-type floating gate; a first opening located in the gate dielectric layer, where the n-type floating gate is in contact with one of the two p-type body regions through the first opening to form a p-n junction diode; and a second opening located in the gate dielectric layer, where the n-type floating gate is in contact with the other of the two p-type body regions through the second opening to form the p-n junction diode.

In an implementation, the n-type floating gate located over the gate dielectric layer is divided into a first n-type floating gate and a second n-type floating gate by an insulating layer, the first n-type floating gate is in contact with one of the two p-type body regions through the first opening to form the p-n junction diode, and the second n-type floating gate is in contact with the other of the two p-type body regions through the second opening to form the p-n junction diode.

In an implementation, the IGBT device further includes an n-type field cut-off region located above the n-type collector region and the p-type collector region, where the n-type field cut-off region is located below the n-type drift region.

In an implementation, the first opening is located below the n-type floating gate and is configured to be close to the n-type drift region.

In an implementation, the second opening is located below the n-type floating gate and is configured to be close to the n-type drift region.

The IGBT power device provided by the embodiment of the present disclosure has a high threshold voltage in a forward blocking state and a forward opening state, and when the IGBT power device is reverse-conducting, the IGBT power device has a low threshold voltage so that the IGBT power device is turned on at a low gate voltage (or a voltage of 0 V), thereby increasing the reverse current flowing through the current channel of the IGBT power device, reducing the current flowing through the body diode parasitic in the IGBT power device, and improving the reverse recovery speed of the IGBT power device.

BRIEF DESCRIPTION OF DRAWINGS

Drawings used in the embodiments are briefly described hereinafter.

DETAILED DESCRIPTION

Figure 1:
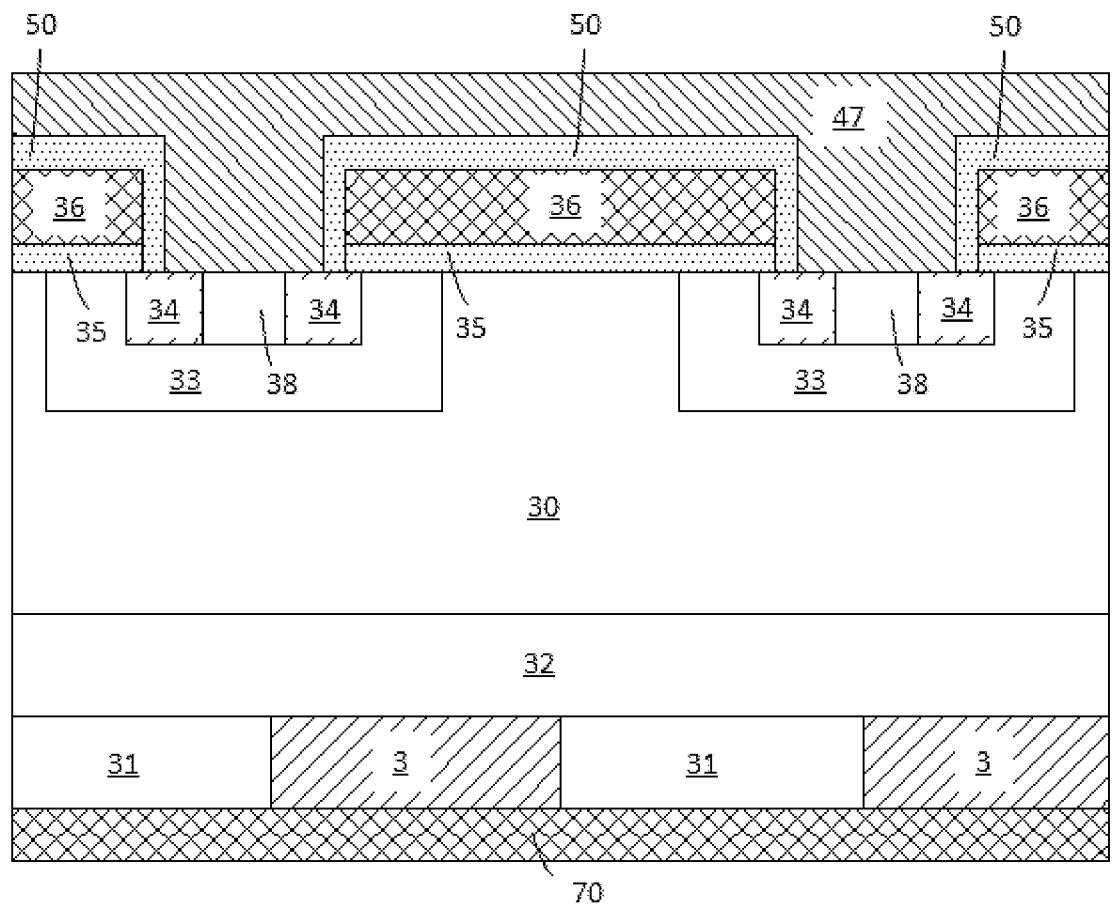
FIG. 1 is a sectional view of an IGBT power device in the related art.

The solution of the present application is described hereinafter through specific implementations in conjunction with the drawings in the embodiments of the present disclosure. Meanwhile, in the schematic diagrams illustrated in the drawings of the specification, the sizes of layers and regions described in the present application are enlarged, and the sizes illustrated in the drawings do not represent the actual sizes. The embodiments described in the Description are not intended to limit the regions shown in the drawings to specific shapes, but include obtained shapes, for example, deviations due to manufacturing.

Figure 2:
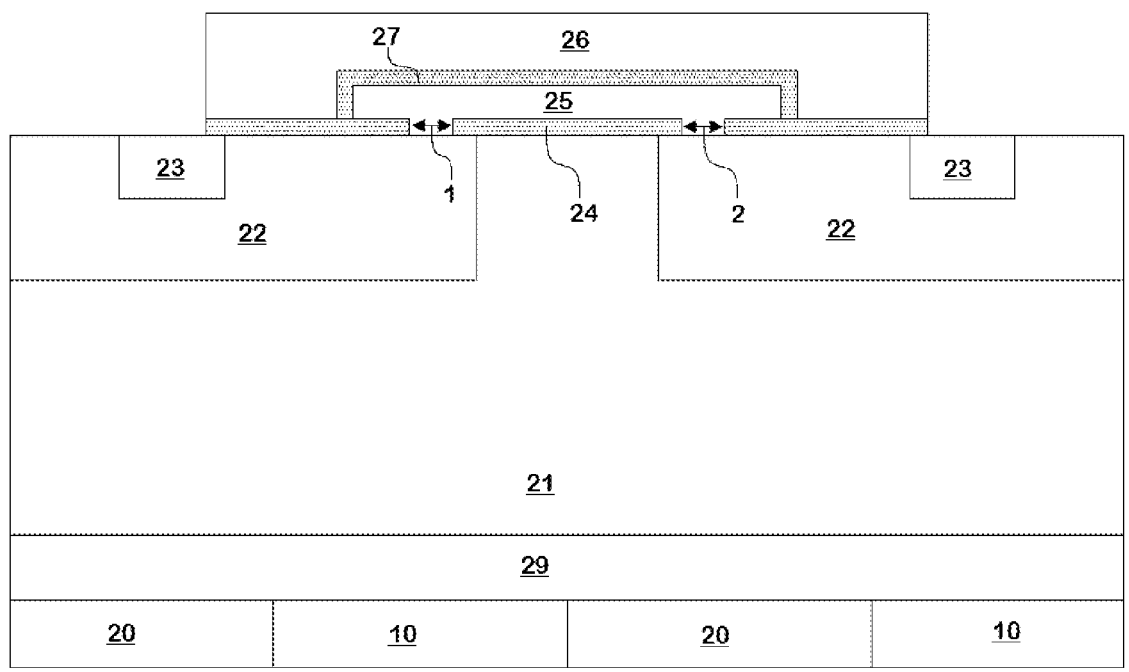
FIG. 2 is a sectional view of a first embodiment of an IGBT power device provided by the present application.

FIG. 2 is a sectional view of a first embodiment of an IGBT power device provided by the present application. As shown in FIG. 2, an IGBT power device provided by an embodiment of the present disclosure includes an n-type collector region 20 and a p-type collector region 10, an n-type field cut-off region 29 located above the n-type collector region 20 and the p-type collector region 10, an n-type drift region 21 located above the n-type field cut-off region 29, and at least two p-type body regions 22 located at a top of the n-type drift region 21, and only two p-type body regions 22 are shown exemplarily in FIG. 2; and an n-type emitter region 23 located within each of the at least two p-type body regions 22; a gate dielectric layer 24 located above the two p-type body regions 22 and the n-type drift region 21 between the two p-type body regions 22, an n-type floating gate 25 located above the gate dielectric layer 24; a gate 26 located above the gate dielectric layer 24 and the n-type floating gate 25, where the gate 26 covers two side walls of the n-type floating gate 25 in a lateral direction; so that the gate 26 and the n-type floating gate 25 simultaneously control the current channel of the IGBT power device to turn on and turn off; and an insulating dielectric layer 27 between the gate 26 and the n-type floating gate 25, where the gate 26 acts on the n-type floating gate 25 through capacitive coupling; and the insulating dielectric layer 27 usually is silicon dioxide; and a first opening 1 located in the gate dielectric layer 24, where the n-type floating gate 25 is in contact with one of the two p-type body regions 22 through the first opening 1 to form a p-n junction diode; and a second opening 2 located in the gate dielectric layer 24, where the n-type floating gate 25 is in contact with the other of the two p-type body regions 22 through the second opening 2 to form the p-n junction diode.

In the IGBT power device in the embodiment of the present disclosure, when the IGBT power device is in the forward blocking state, the n-type drain region 20 and the p-type drain region 10 are applied with a high voltage, the p-n junction diode formed by the n-type floating gate 25 and the p-type body regions 22 is forward biased, and the n-type floating gate 25 is charged with positive charges. This reduces a threshold voltage Vht1 of the current channel below the n-type floating gate 25. A voltage of the n-type floating gate 25 is related to a position of the first opening 1 and the second opening 2 in the gate dielectric layer 24. In an embodiment, the first opening 1 is located below the n-type floating gate 25 and is configured to be close to the n-type drift region 21. Meanwhile, the second opening 2 is located below the n-type floating gate 25 and is configured to be close to the n-type drift region 21, that is, the first opening 1 is formed in the gate dielectric layer 24 located between one of the two p-type body region 22 and the n-type drift region 21 (the n-type drift region 21 between the two p-type body regions 22), and the first opening 1 is configured to be closer to this part of the n-type drift region 21, meanwhile, the second opening 2 is formed in the gate dielectric layer 24 located between the other of the two p-type body regions 22 and the n-type drift region 21 (the n-type drift region 21 between the two p-type body regions 22), and the second opening 2 is configured to be closer to this part of the n-type drift region 21. In this case, the n-type floating gate 25 can be more easily written into positive charges, so that the voltage of the n-type floating gate 25 can be increased and the threshold voltage Vht1 of the current channel below the n-type floating gate 25 can be reduced.

In the embodiment of the present disclosure, in a case where the IGBT power device is in a forward blocking state and a forward turn-on state, a collector-emitter voltage Vce is greater than 0 V, the threshold voltage Vht1 of the current channel below the n-type floating gate 25 has little influence on a threshold voltage Vth of the IGBT power device, and the IGBT power device still has a high threshold voltage Vth. In the embodiment of the present disclosure, in a case where the IGBT power device is turned off, when a source-drain voltage Vec is greater than 0 V, the threshold voltage Vht1 of the current channel below the n-type floating gate 25 has a great influence on the threshold voltage Vth of the entire IGBT power device, so the IGBT power device has a low threshold voltage Vth, thus the IGBT power device is turned on at a low gate voltage (or a voltage of 0 V). This can increase the current channel current flowing through the IGBT power device, reduce the current flowing through a body diode parasitic in the IGBT power device, and improve the reverse recovery speed of the IGBT power device.

Figure 3:
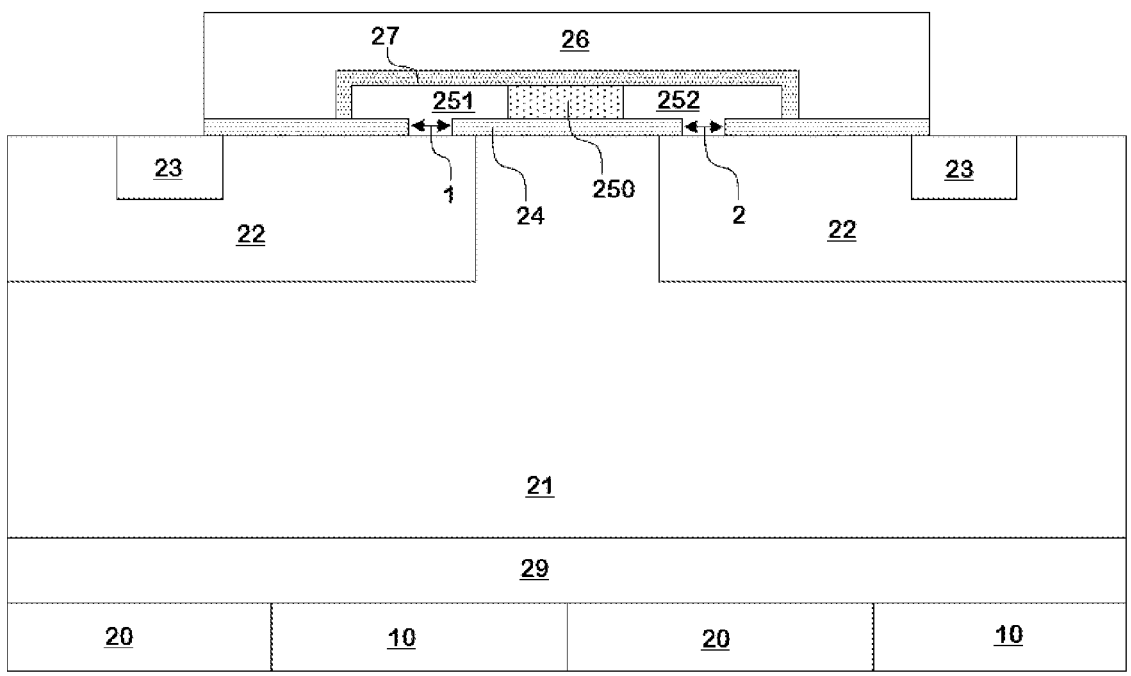
FIG. 3 is a sectional view of a second embodiment of an IGBT power device provided by the present application.

FIG. 3 is a sectional view of a second embodiment of an IGBT power device provided by the present application. The IGBT power device in this embodiment differs from a structure of the IGBT power device shown in FIG. 2 in that in this embodiment, the n-type floating gate 250 located over the gate dielectric layer 24 is divided into a first n-type floating gate 251 and a second n-type floating gate 252 by an insulating layer 250, the first n-type floating gate 251 is in contact with one of the two p-type body regions 22 through the first opening 1 to form the p-n junction diode, and the second n-type floating gate 252 is in contact with the other of the two p-type body regions 22 through the second opening 2 to form the p-n junction diode. The n-type floating gate is divided into two n-type floating gate structures, and after the n-type floating gate is charged with the positive charges, the voltage of the n-type floating gate can be higher, so that when the IGBT power device is reverse-conducting, the current channel of the IGBT power device is easier to be turned on.

What is claimed is:

1. An insulated gate bipolar transistor (IGBT) power device, comprising:
   an n-type collector region and a p-type collector region, an n-type drift region located above the n-type collector region and the p-type collector region, at least two p-type body regions located at a top of the n-type drift region, wherein two p-type body regions of the at least two p-type body regions are isolated by the n-type drift region; and an n-type emitter region located within each p-type body region of the at least two p-type body regions;
   a gate dielectric layer located above the two p-type body regions and the n-type drift region between the two p-type body regions, an n-type floating gate located above the gate dielectric layer; a gate located above the gate dielectric layer and the n-type floating gate, wherein the gate covers two side walls of the n-type floating gate in a lateral direction; and an insulating dielectric layer between the gate and the n-type floating gate;
   a first opening located in the gate dielectric layer, wherein the n-type floating gate in contact with one p-type body region of the two p-type body regions through the first opening to form a p-n junction diode; and
   a second opening located in the gate dielectric layer, wherein the n-type floating gate is in contact with the other p-type body region of the two p-type body regions through the second opening to form a p-n junction diode.

2. The IGBT power device of claim 1, wherein the n-type floating gate located above the gate dielectric layer is divided into a first n-type floating gate and a second n-type floating gate by an insulating layer, the first n-type floating gate is in contact with one p-type body region of the two p-type body regions through the first opening to form a p-n junction diode, and the second n-type floating gate is in contact with the other p-type body region of the two p-type body regions through the second opening to form a p-n junction diode.

3. The IGBT power device of claim 1, further comprising: an n-type field cut-off region located above the n-type collector region and the p-type collector region, wherein the n-type field cut-off region is located below the n-type drift region.

4. The IGBT power device of claim 1, wherein the first opening is located below the n-type floating gate and is provided to be close to the n-type drift region.

5. The IGBT power device of claim 1, wherein the second opening is located below the n-type floating gate and is configured to be close to the n-type drift region.

* * * * *